United States Patent
Lee et al.

(10) Patent No.: US 9,503,117 B2
(45) Date of Patent: Nov. 22, 2016

(54) SEMICONDUCTOR DEVICE COMPRISING ANALOG TO DIGITAL CONVERTERS SHARING REFERENCE CAPACITOR AND SYSTEM ON CHIP COMPRISING THE SAME

(71) Applicants: Jong-Woo Lee, Seoul (KR);
Seung-Hyun Oh, Seoul (KR);
Byung-Hak Cho, Gyeonggi-do (KR)

(72) Inventors: Jong-Woo Lee, Seoul (KR);
Seung-Hyun Oh, Seoul (KR);
Byung-Hak Cho, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/052,474

(22) Filed: Feb. 24, 2016

(65) Prior Publication Data

US 2016/0269040 A1    Sep. 15, 2016

Related U.S. Application Data

(60) Provisional application No. 62/132,145, filed on Mar. 12, 2015.

(30) Foreign Application Priority Data

Jun. 18, 2015    (KR) .......................... 10-2015-0086350

(51) Int. Cl.
*H03M 1/38*    (2006.01)
*H03M 1/06*    (2006.01)
(Continued)

(52) U.S. Cl.
CPC ................ *H03M 1/38* (2013.01); *H03M 1/00* (2013.01); *H03M 1/0695* (2013.01); *H03M 1/12* (2013.01)

(58) Field of Classification Search
CPC ....... H03M 1/0695; H03M 1/12; H03M 1/00
USPC ........ 341/161, 155, 122, 120, 110, 118, 158
See application file for complete search history.

(56) References Cited

U.S. PATENT DOCUMENTS 7,190,298 B2    3/2007    Mulder
7,286,074 B2    10/2007   Kudoh et al.
(Continued)

FOREIGN PATENT DOCUMENTS

JP    2011-066626    3/2011
JP    4974214    4/2012
(Continued)

*Primary Examiner* — Joseph Lauture
(74) *Attorney, Agent, or Firm* — The Farrell Law Firm, P.C.

(57) ABSTRACT

Provided are a semiconductor device and a System on Chip (SoC). The semiconductor device includes a reference capacitor that receives a reference voltage from a reference voltage generator, a first successive approximation register analog-to-digital converter (SAR ADC), for converting a first analog signal into a first digital signal, using a first sampling capacitor that has a first capacitance and is connected to the reference capacitor through a first switching element, and a second sampling capacitor that has a second capacitance that is less than that of the first sampling capacitor, connected to the reference capacitor through a second switching element, a second SAR ADC, for converting a second analog signal into a second digital signal, using a third sampling capacitor that has a third capacitance, connected to the reference capacitor through a third switching element, and a fourth sampling capacitor that has a fourth capacitance that is less than that of the third sampling capacitance connected to the reference capacitor through a fourth switching element, and a controller configured to connect the first switching element and the third switching element to the reference capacitor at different times.

19 Claims, 15 Drawing Sheets

(51) Int. Cl.
*H03M 1/00* (2006.01)
*H03M 1/12* (2006.01)

(56) References Cited

U.S. PATENT DOCUMENTS

| | | |
|---|---|---|
| 8,094,056 B2 | 1/2012 | Nazemi et al. |
| 8,492,697 B2 | 7/2013 | Neubauer et al. |
| 8,587,465 B2 | 11/2013 | Chen et al. |
| 8,836,567 B2 | 9/2014 | Lin |
| 2015/0077320 A1* | 3/2015 | Sato .................. H03M 1/0634 345/102 |

FOREIGN PATENT DOCUMENTS

| | | |
|---|---|---|
| KR | 10-1246548 | 3/2013 |
| KR | 10-1435978 | 8/2014 |

* cited by examiner

1200

1300

1400

SEMICONDUCTOR DEVICE COMPRISING ANALOG TO DIGITAL CONVERTERS SHARING REFERENCE CAPACITOR AND SYSTEM ON CHIP COMPRISING THE SAME

PRIORITY

This application claims priority under 35 U.S.C. §119(e) to a U.S. Provisional Patent Application filed on Mar. 12, 2015 in the U.S. Patent and Trademark Office and assigned Ser. No. 62/132,145 and under 35 USC §119(a) to a Korean Patent Application filed on Jun. 18, 2015 in the Korean Intellectual Property Office and assigned Serial No. 10-2015-0086350, the entire contents of which are incorporated herein by reference.

BACKGROUND

1. Field of the Disclosure

The present disclosure relates generally to a semiconductor device including analog digital converters that share a reference capacitor and a system on chip (SoC) including the same, and more particularly, to a semiconductor device including analog digital converters that share a reference capacitor, and an SoC including the same with a reduced size.

2. Description of the Related Art

An analog-to-digital converter (ADC) is used to generate a sequence of digital codes that represent each signal level of an analog signal.

Recently, a successive approximation method which repeatedly performs digital-to-analog conversion to compare data and determine the bits of a digital code has been used.

SUMMARY

An aspect of the present disclosure is to provide a semiconductor device with a reduced size.

Another aspect of the present disclosure is to provide an SoC with a reduced size.

Another aspect of the present disclosure provides a first sampling capacitor to determine a most significant bit (MSB) of a first digital signal, and a third sampling capacitor to determine the MSB of a second digital signal.

Another aspect of the present disclosure provides a capacitance of a reference capacitor that is greater than a capacitance of a first sampling capacitor and is greater than a capacitance of a second sampling capacitor.

Another aspect of the present disclosure provides a first analog signal that includes an in-phase signal and a second analog signal that includes a quadrature phase signal.

Another aspect of the present disclosure provides a controller that sequentially connects a first to fourth switching elements to a reference capacitor.

Another aspect of the present disclosure provides a controller that connects a third switching element to a reference capacitor, while a second switching element is connected to the reference capacitor.

Another aspect of the present disclosure provides a controller that includes a delay line that provides a control signal to a first switching element and a third switching element.

Another aspect of the present disclosure provides a third successive approximation register analog-to-digital converter (SAR ADC) that shares a reference capacitor along with a first and second SAR ADCs, and converts a third analog signal into a third digital signal, using the reference capacitor and a plurality of third sampling capacitors, and a fourth SAR ADC that shares the reference capacitor along with the first to third SAR ADCs, and converts a fourth analog signal into a fourth digital signal, using the reference capacitor and a plurality of fourth sampling capacitors.

Another aspect of the present disclosure provides a first analog signal and a second analog signal that includes an in-phase signal, and a third analog signal and a fourth analog signal that includes a quadrature phase signal.

Another aspect of the present disclosure includes a third SAR ADC that converts a third analog input signal into a third digital signal using a fifth sampling capacitor that has a fifth capacitance and shares a reference capacitor through a fifth switching element, and a sixth sampling capacitor that has a sixth capacitance that is less than the fifth capacitance and shares the reference capacitor through a sixth switching element, and a fourth SAR ADC that converts a fourth analog input signal into a fourth digital signal using a seventh sampling capacitor that has a seventh capacitance and shares the reference capacitor through a seventh switching element, and an eighth sampling capacitor that has an eighth capacitance that is less than the seventh capacitance and shares the reference capacitor through an eighth switching element, wherein a controller connects a first switching element, a third switching element, the fifth switching element and the seventh switching to the reference capacitor at different times.

Another aspect of the present disclosure provides a controller that connects a fifth switching element to a reference capacitor, while a second switching element is connected to the reference capacitor.

Another aspect of the present disclosure provides a controller that connects a seventh switching element to a reference capacitor, while a fourth switching element is connected to the reference capacitor.

Another aspect of the present disclosure provides a controller that does not connect a fourth sampling capacitor to a reference capacitor, while a third sampling capacitor is connected to the reference capacitor.

Another aspect of the present disclosure provides a capacitance of a reference capacitor that is greater than a capacitance of a third sampling capacitor, and the capacitance of the reference capacitor is greater than a capacitance of a fourth sampling capacitor.

Another aspect of the present disclosure provides third and fourth SAR ADCs that share a reference capacitor along with first and second SAR ADCs, where the third SAR ADC converts a third analog signal into a third digital signal, using the reference capacitor and a plurality of fifth sampling capacitors having different capacitances, and where the fourth SAR ADC converts a fourth analog signal into a fourth digital signal, using the reference capacitor and a plurality of sixth sampling capacitors having different capacitances, wherein a controller connects a sampling capacitor having the largest capacitance among the plurality of fifth sampling capacitors to the reference capacitor at a third time that is later than a second time, and connects a sampling capacitor having the largest capacitance among the plurality of sixth sampling capacitors to the reference capacitor at a fourth time that is later than a third time.

Another aspect of the present disclosure provides a semiconductor device including a first SAR ADC that receives a first analog signal when a sampling signal is in a first level and converts the first analog signal into a first digital signal when the sampling signal is in a second level different from the first level using a reference capacitor and a plurality of first sampling capacitors, a second SAR ADC that receives a second analog signal when a sampling signal is in the first level and converts a second analog signal into a second digital signal when the sampling signal is in a second level using the reference capacitor and a plurality of second sampling capacitors shared with the first SAR ADC, and a controller that controls the first and second SAR ADCs so that a determination timing of a most significant bit (MSB) of the first digital signal is different from a determination timing of an MSB of the second digital signal.

Another aspect of the present disclosure provides a controller that controls a determination timing of an MSB of a first digital signal and a determination timing of an MSB of a second digital signal, in consideration of a length of a section in which the sampling signal is in the second level.

Another aspect of the present disclosure provides a controller that controls determination timings of MSBs of first and second digital signals so that a least significant bit (LSB) of the second digital signal is determined before the sampling signal is converted from a second level into a first level.

Another aspect of the present disclosure provides a reference capacitor internal to an SoC.

According to an aspect of the present disclosure, there is provided a semiconductor device. The semiconductor device includes a reference capacitor that receives a reference voltage from a reference voltage generator, a first SAR ADC, for converting a first analog signal into a first digital signal, using a first sampling capacitor that has a first capacitance, connected to the reference capacitor through a first switching element, and a second sampling capacitor that has a second capacitance that is less than that of the first sampling capacitor, connected to the reference capacitor through a second switching element, a second SAR ADC, for converting a second analog signal into a second digital signal, using a third sampling capacitor that has a third capacitance, connected to the reference capacitor through a third switching element, and a fourth sampling capacitor that has a fourth capacitance that is less than that of the third sampling capacitor connected to the reference capacitor through a fourth switching element, and a controller configured to connect the first switching element and the third switching element to the reference capacitor at different times.

According to another aspect of the present disclosure, there is provided a semiconductor device. The semiconductor device includes a reference capacitor that receives a reference voltage from a reference voltage generator, a first SAR ADC, for converting a first analog signal into a first digital signal, using the reference capacitor and a plurality of first sampling capacitors having different capacitances, a second SAR ADC connected to the reference capacitor along with the first SAR ADC, for converting a second analog signal into a second digital signal, using the reference capacitor and a plurality of second sampling capacitors having different capacitances, and a controller configured to connect a third sampling capacitor having a largest capacitance among the plurality of first sampling capacitors to the reference capacitor at a first time, and connect a fourth sampling capacitor having a largest capacitance among the plurality of second sampling capacitors to the reference capacitor at a second time different from the first time.

According to another aspect of the present disclosure, there is provided a semiconductor device. The semiconductor device includes a first SAR ADC, for receiving a first analog signal when a sampling signal is in a first level and converting the first input analog signal into a first digital signal when the sampling signal is in a second level different from the first level, using a reference capacitor and a plurality of first sampling capacitors; a second SAR ADC, for receiving a second analog signal when the sampling signal is in the first level and converting the second input analog signal into a second digital signal when the sampling signal is in the second level, using the reference capacitor and a plurality of second sampling capacitors connected to the first SAR ADC; and a controller configured to control the first SAR ADC and the second SAR ADC so that a determination time of an MSB of the first digital signal is different from a determination time of an MSB of the second digital signal.

According to another aspect of the present disclosure, there is provided an SoC. The SoC includes a terminal a first analog signal and a second analog signal, a first SAR ADC, for converting the first analog signal into a first digital signal, using a plurality of first sampling capacitors, a second SAR ADC, for converting the second analog signal into a second digital signal, using a plurality of second sampling capacitors, a reference capacitor connected to the first SAR ADC and the second SAR ADC, wherein the reference capacitor is configured to provide a supplied reference voltage to a first sampling capacitor having a largest capacitance among the plurality of first sampling capacitors at a first time, and supply the reference voltage to a second sampling capacitor having a largest capacitance among the plurality of second sampling capacitors at a second time that is different from the first time, and a digital signal processor configured to perform digital signal processing on the first and second digital signals.

BRIEF DESCRIPTION OF THE DRAWINGS

The above and other aspects, features, and advantages of the present disclosure will be more apparent from the detailed description, taken in conjunction with the accompanying drawings, in which.

DETAILED DESCRIPTION OF THE EMBODIMENTS OF THE PRESENT DISCLOSURE

Figure 1:
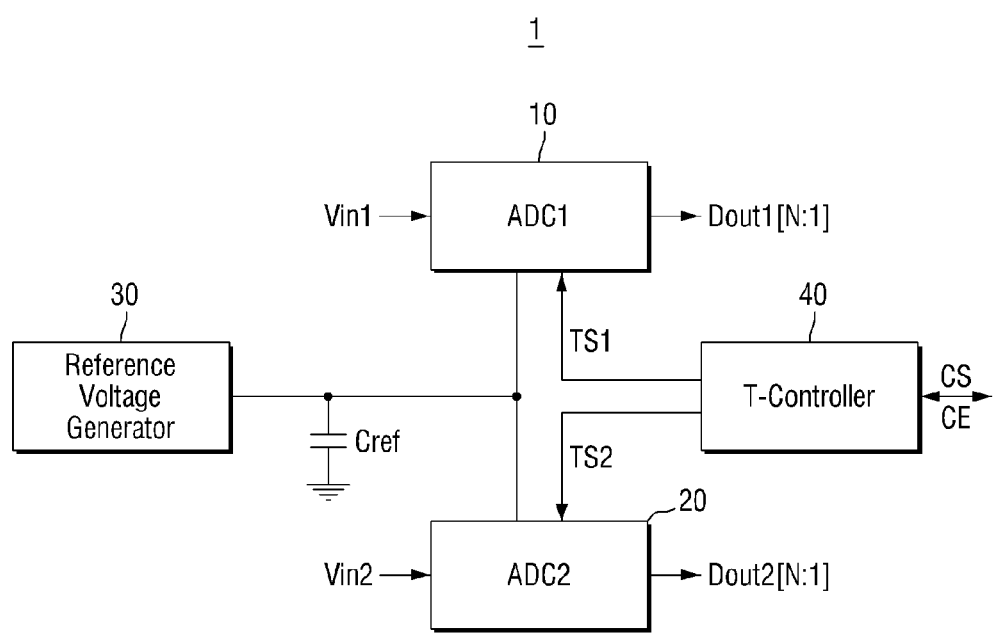
FIG. 1 is a block diagram of a semiconductor device according to an embodiment of the present disclosure.

Advantages and features of the present disclosure and methods of accomplishing the same may be understood more readily by reference to the following detailed description and the accompanying drawings. The present disclosure may, however, be embodied in many different forms and should not be construed as being limited to the embodiments set forth herein. Rather, these embodiments are provided so that the present disclosure will be thorough and complete and will fully convey the present disclosure to those skilled in the art, where the present disclosure is defined by the appended claims and their equivalents. Like reference numerals refer to like elements throughout the present disclosure and the accompanying drawings.

The terminology used herein is for the purpose of describing certain embodiments of the present disclosure only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in the present disclosure, indicate the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be referred to as a second element, component, region, layer or section without departing from the scope and spirit of the present disclosure.

Spatially relative terms, such as "beneath," "below," "lower," "above," "upper," and the like, may be used herein for ease of description to describe one element or a feature's relationship to another element(s) or feature(s) as illustrated in the accompanying drawings. It will be understood that the spatially relative terms are intended to encompass different orientations of a device in use or operation in addition to the orientation depicted in the accompanying drawings. For example, if a device in the accompanying drawings is turned over, elements described as "below" or "beneath" other elements or features would then be oriented "above" the other elements or features. Thus, the term "below" can encompass both an orientation of above and below. A device may be otherwise oriented (e.g., rotated 90 degrees or at other orientations) and the spatially relative descriptors used herein are interpreted accordingly.

Embodiments of the present disclosure are described herein with reference to illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as being limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the accompanying drawings are schematic in nature and their shapes are not intended to illustrate an actual shape of a region of a device and are not intended to limit the scope of the present disclosure.

Unless otherwise defined, all terms (including technical and scientific terms) used herein have the same meanings as commonly understood by one of ordinary skill in the art to which the present disclosure belongs. It will be further understood that terms, such as those defined in commonly used dictionaries, should be interpreted as having meanings that are consistent with their meanings in the context of the relevant art and the present disclosure and should not be interpreted in an idealized or overly formal sense unless expressly so defined herein.

Figure 2:
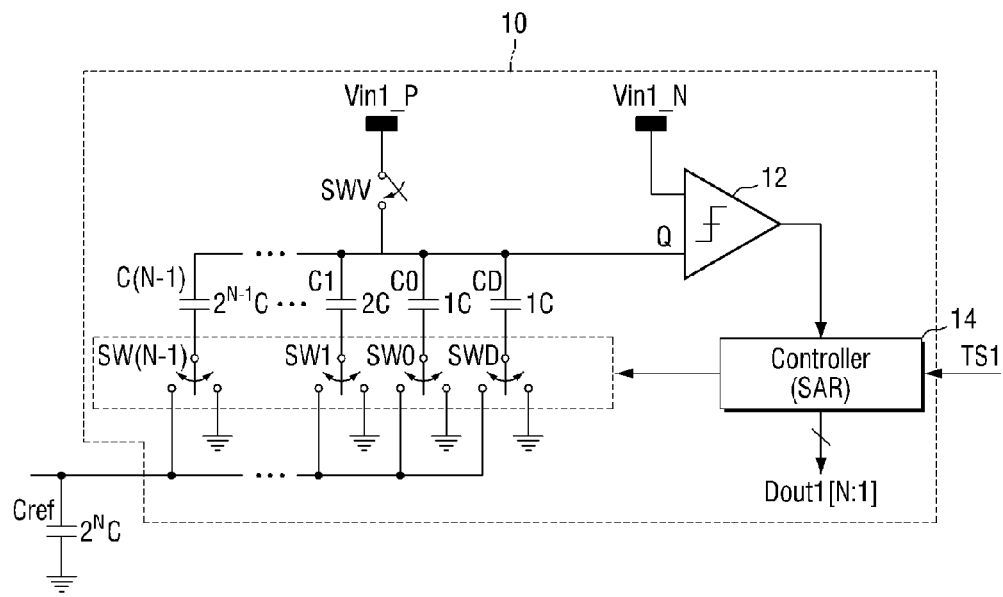
FIG. 2 is a block diagram of a first SAR ADC of FIG. 1 according to an embodiment of the present disclosure.
Figure 3:
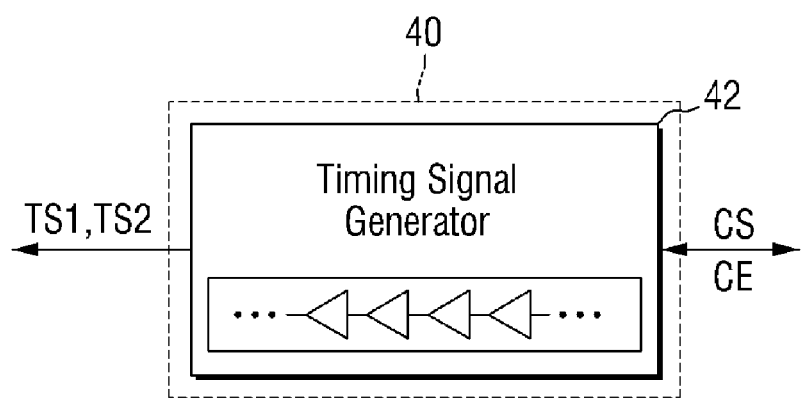
FIG. 3 is a block diagram of a timing controller of FIG. 1 according to an embodiment of the present disclosure.

FIG. 1 is a block diagram of a semiconductor device according to an embodiment of the present disclosure. FIG. 2 is a block diagram of a first SAR ADC of FIG. 1 according to an embodiment of the present disclosure. FIG. 3 is a block diagram of a timing controller of FIG. 1 according to an embodiment of the present disclosure.

Referring to FIGS. 1 to 3, a semiconductor device 1 includes a first SAR ADC 10, a second SAR ADC 20, a reference voltage generator 30, a timing controller 40 and a reference capacitor Cref.

The first SAR ADC 10 and the second SAR ADC 20 can convert an analog signal into a digital signal, using a successive approximation method.

For example, after the first SAR ADC 10 receives an input of a first analog signal Vin1 and determines each bit of N bits (where, N, for example, is a natural number) of a first digital signal Dout1 that results from the successive approximation method, the first SAR ADC 10 can output each bit. After the second SAR ADC 20 receives an input of a second analog signal Vin2 and determines each bit of N bits (where, N, for example, is a natural number) of a second digital signal Dout2 that results from the successive approximation method, the second SAR ADC 20 can output each bit.

The reference voltage generator 30 can generate a reference voltage that is necessary for the conversion operation of the first and second SAR ADCs 10 and 20. The reference voltage generated by the reference voltage generator 30 can be stored in a reference voltage capacitor Cref.

In an embodiment of the present disclosure, the first and second SAR ADCs 10 and 20 can be mutually connected to the reference voltage capacitor (Cref). That is, the first and second SAR ADCs 10 and 20 receive the reference voltage from the same reference voltage capacitor Cref and can perform an analog-to-digital conversion.

In this way, since the reference voltage is provided to the first and second SAR ADCs 10 and 20 through the reference voltage capacitor Cref, the operational stability of the first and second SAR ADCs 10 and 20 can be improved, as compared to a case where the reference voltage generator 30 is directly connected to the first and second SAR ADCs 10 and 20.

The timing controller 40 can control the conversion operation timing of the first and second SAR ADCs 10 and 20. For example, the timing controller 40 can control the timing at which the first and second SAR ADCs 10 and 20 start the conversion operation. For example, the timing controller 40 can control the operation of the first and second SAR ADCs 10 and 20 so that the start time of the conversion operation of the first SAR ADC 10 is different from the start time of the conversion operation of the second SAR ADC 20. This is described below in more detail.

The timing controller 40, for example, which receives the conversion operation start signal CS, can determine the conversion operation timing of the first SAR ADC 10 by providing a first timing signal TS1 to the first SAR ADC 10, and can determine the conversion operation timing of the second SAR ADC 20 by providing a second timing signal TS2 to the second SAR ADC 20.

Further, the timing controller 40, for example, can output a conversion operation end signal CE, when the conversion operations of the first and second SAR ADCs 10, 20 are finished.

However, this is merely an example for explaining the present disclosure, but an embodiment of the present disclosure is not limited thereto.

Figure 4:
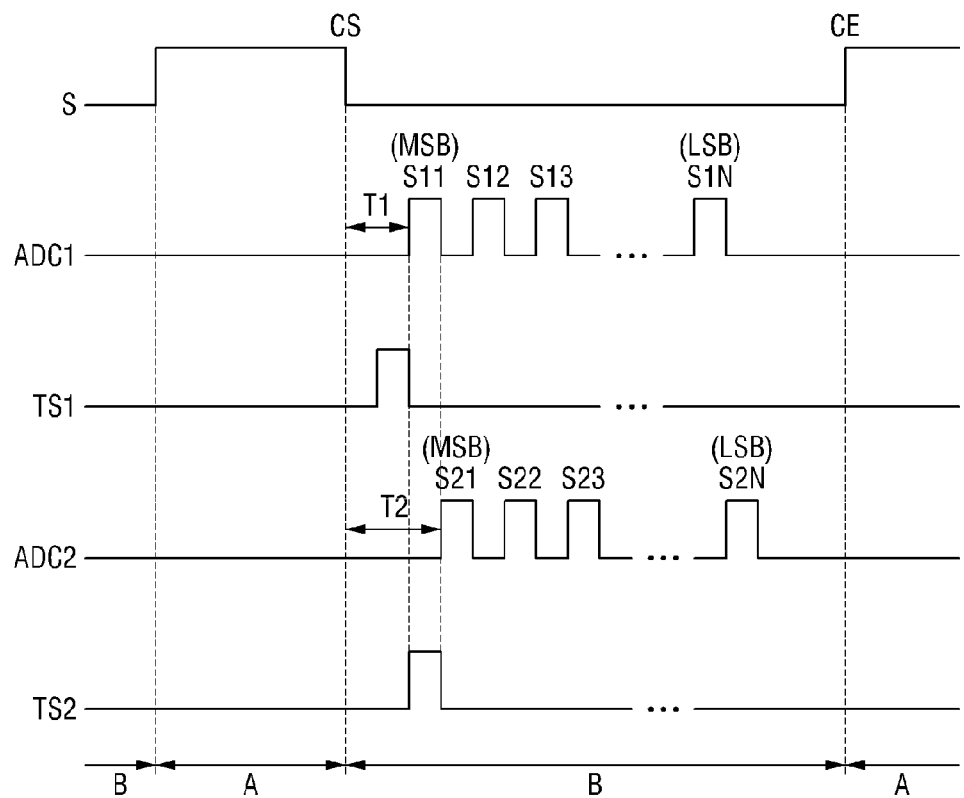
FIG. 4 is a timing diagram of an operation of a semiconductor device according to an embodiment of the present disclosure.

For example, in an embodiment of the present disclosure, the timing controller 40 can directly receive a sampling signal (for example, S in FIG. 4). In this case, the timing controller 40 can control the conversion operation of the first and second SAR ADCs 10 and 20, by detecting a change in a level of a sampling signal (for example, S in FIG. 4).

Although the timing controller 40 is illustrated separately from the first and second SAR ADCs 10 and 20 in FIG. 1 for convenience of explanation, an embodiment of the present disclosure is not limited thereto. In an embodiment of the present disclosure, the timing controller 40, for example, can be implemented internally to the first and second SAR ADCs 10 and 20. That is, the function of the timing controller 40 can be integrated into a controller (for example, 14 in FIG. 2) internally to the first and second SAR ADCs 10 and 20 as described below.

Further, in an embodiment of the present disclosure, the timing controller 40 may be implemented as a software module for controlling the controller (for example, 14 in FIG. 2) included within the first and second SAR ADCs 10 and 20. That is, the block division illustrated in FIG. 1 is only for convenience of understanding, and an embodiment of the present disclosure is not limited thereto.

Referring to FIG. 2, the first SAR ADC 10 can include a plurality of sampling capacitors C0 to C(N−1), a plurality of sampling switching elements SW0 to SW(N−1), a first switching element SWD, a first capacitor CD, a second switching element SWV, a comparator 12 and a controller 14.

Since the configuration of the second SAR ADC 20 in FIG. 1 can be substantially the same as the configuration of the first SAR ADC 10 described below, a duplicate description is not provided.

Although the plurality of sampling switching elements SW0 to SW(N−1), the first switching element SWD and the second switching element SWV are illustrated in the form of a switch in the drawings, they can be implemented as elements of various forms that perform a switching function. For example, in some embodiments of the present disclosure, the plurality of sampling switching elements SW0 to SW(N−1) and the first switching element SWD can be implemented in the form of a multiplexer, but the present disclosure is not limited thereto.

The second switching element SWV can be disposed between an input terminal, to which a first sub-analog signal Vin1_P is input, and a plurality of sampling capacitors C0 to C(N−1). For example, the controller 14 can control the second switching element SWV so that the input terminal, to which the first sub-analog signal Vin1_P is input, is connected to the plurality of sampling capacitors C0 to C(N−1).

The plurality of sampling switching elements SW0 to SW(N−1) and the first switching element SWD can be disposed between the plurality of sampling capacitors C0 to C(N−1), the first capacitor CD and the reference capacitor Cref. Also, the plurality of sampling switching elements SW0 to SW(N−1) and the first switching element SWD can be disposed between the plurality of sampling capacitors C0 to C(N−1), the first capacitor CD and a ground electrode. For example, the controller 14 can control the plurality of sampling switching elements SW0 to SW(N−1) and the first switching element SWD so that the plurality of sampling switching elements SW0 to SW(N−1) and the first switching element SWD are connected to one of the reference capacitor Cref and the ground electrode.

The plurality of sampling capacitors C0 to C(N−1) can have different capacitances. For example, the plurality of sampling capacitors C0 to C(N−1) according to an embodiment of the present disclosure may be a binary weighted capacitor. For example, when the capacitance of the sampling capacitor C0 is 1 C, the capacitance of the sampling capacitor C1 can be 2 C, and the capacitance of the sampling capacitor C(N−1) can be $2^{N-1}$ C.

The capacitance of the reference capacitor Cref connected to the plurality of sampling capacitors C0 to C(N−1), depending on the operation of the plurality of sampling switching elements SW0 to SW(N−1), can be greater than the respective capacitances of the plurality of sampling capacitors C0 to C(N−1). That is, the capacitance of the reference capacitor Cref can be greater than the capacitance of the sampling capacitor C(N−1) having the largest capacitance among the plurality of sampling capacitors C0 to C(N−1). The reason the capacitance of the reference capacitor Cref is large can be due to the fact that the plurality of sampling capacitors C0 to C(N−1) share the reference capacitor Cref in the analog-to-digital conversion operation using a successive approximation method described below. While a case where the capacitance of the reference capacitor Cref is $2^N C$ is described as an example, the present disclosure is not limited thereto.

In addition, the capacitance of the first capacitor CD can be 1 C, similarly to the capacitance of the sampling capacitor C0. The first capacitor CD may be required to keep the sum of the capacitances of the plurality of sampling capacitors C0 to C(N−1) and the capacitance of the reference capacitor Cref at the same level. Therefore, when the capacitances of the plurality of sampling capacitors C0 to C(N−1) are otherwise modified or the capacitance of the reference capacitor Cref is otherwise modified, the first capacitor CD and the first switching element SWD may be omitted as required.

The comparator 12 compares the voltage of the comparison node Q connected to one end to the second sub-analog signal Vin1_N connected to the other end of the comparator 12 and can output the result. While the second sub-analog signal Vin1_N is directly input to the other end of the comparator 12, an embodiment of the present disclosure is not limited thereto.

In an embodiment of the present disclosure, a sample and hold circuit which samples and holds a first analog signal (e.g. Vin1 in FIG. 1) may be connected to the other end of the comparator 12. Also, in an embodiment of the present disclosure, a plurality of comparison capacitors may be connected to the other end of the comparator 12. The plurality of comparison capacitors is charged with the second sub-analog signal Vin1_N and has a configuration that is substantially similar to the plurality of sampling capacitors C0 to C(N−1).

While an embodiment of the present disclosure may be described where the first analog signal (e.g. Vin1 in FIG. 1) is provided to the comparator 12, as a first sub-analog signal Vin1_P that is a positive signal, and as the second sub-analog signal Vin1_N that is a negative signal, an embodiment of the present disclosure is not limited thereto.

By modifying the configuration of the plurality of sampling switching elements SW0 to SW(N−1), the first switching element SWD and the second switching element SWV, the configuration of the first SAR ADC 10 may be performed by being modified in a form in which the first analog signal (e.g. Vin1 in FIG. 1) is provided to one end of the comparator 12 while the other end of the comparator 12 is connected to the ground electrode.

The controller 14 can control the plurality of sampling switching elements SW0 to SW(N−1), the first switching element SWD and the second switching element SWV. For example, the controller 14 can sample the first sub-analog signal Vin1_P by controlling the second switching element SWV at a time when there is a need to sample the first analog signal (e.g. Vin1 in FIG. 1) provided externally. Further, the controller 14 can control the plurality of sampling switching elements SW0 to SW(N−1) and the first switching element SWD, for example, by receiving the first timing signal TS1 at the time of converting the first analog signal (e.g. Vin1 in FIG. 1) into the first digital signal Dout1.

In an embodiment of the present disclosure, the controller 14 can include a register that sequentially stores the output of the comparator 12 for determining each bit of the first digital signal Dout1. The controller 14 can output the data stored in the register to the first digital signal Dout1.

Although the controller 14 is illustrated to include the register in FIG. 2, an embodiment of the present disclosure is not limited thereto. If necessary, the register (e.g. a SAR) may be separate from the controller 14.

Referring to FIG. 3, the timing controller 40 can include a timing signal generator 42 that receives the conversion operation start signal CS to output a first timing signal TS1 and a second timing signal TS2 at different times. The timing signal generator 42, for example, can include a delay line. However, this is only an example, and the timing signal generator 42 may include another configuration for outputting the first timing signal TS1 and the second timing signal TS2 at different times.

FIG. 4 is a timing diagram of an operation of a semiconductor device according to an embodiment of the present disclosure.

Referring to FIGS. 1 to 4, in a section A of FIG. 4 in which the signal level of the sampling signal S is a first level (e.g., a logic high level), the first SAR ADC 10 can sample the first analog signal Vin1, and the second SAR ADC 20 can sample the second analog signal Vin2. In an embodiment of the present disclosure, for example, when the timing controller 40 outputs the conversion operation end signal CE, the first SAR ADC 10 can sample the first analog signal Vin1, and the second SAR ADC 20 can sample the second analog signal Vin2.

Since the operation of the first SAR ADC 10 can be substantially identical to that of the second SAR ADC 20, only the operation of the first SAR ADC 10 is described below.

The controller 14 can connect the plurality of sampling switching elements SW0 to SW(N−1) and the first switching element SWD to the ground electrode and can turn on the second switching element SWV so that the first SAR ADC 10 samples the first analog signal Vin1. Thus, the first sub-analog signal Vin1_P charges the plurality of sampling capacitors C0 to C(N−1) and the first capacitor CD, and the voltage level of the comparison node Q can become identical to the voltage level of the first analog signal Vin1.

Then, in a section B of FIG. 4 in which the signal level of the sampling signal S is a second level (e.g., a logic low level), the timing controller 40 can output the first timing signal TS1 to the first SAR ADC 10. In an embodiment of the present disclosure, for example, when the timing controller 40 is provided with the conversion operation start signal CS, the timing controller 40 can output the first timing signal TS1 to the first SAR ADC 10 so that the conversion operation of the first SAR ADC 10 can start at a first time T1.

Thus, the controller 14 that receives the first timing signal TS1 can connect the sampling capacitor C(N−1) to the reference capacitor Cref by controlling the sampling switching element SW(N−1). Thus, the voltage level of the comparison node Q can change. In an embodiment of the present disclosure, the voltage level of the comparison node Q, for example, can be half of the reference voltage.

The comparator 12 can compare the fluctuated voltage level of the comparison node Q to the second sub-analog signal Vin1_N. If the voltage level of the comparison node Q is greater than the second sub-analog signal Vin1_N, the controller 14 connects the sampling capacitor C(N−1) to the ground electrode by controlling the sampling switching element SW(N−1), and can store the result output from the comparator 12 in the register.

Alternatively, when the voltage level of the comparison node Q is less than the second sub-analog signal Vin1_N, the controller 14 connects the sampling capacitor C(N−1) to the reference capacitor Cref by controlling the sampling switching element SW(N−1), and can store the result output from the comparator 12 in the register.

By such an operation, a most significant bit (MSB) (e.g. S11 in FIG. 4) of the first digital signal Dout1 can be determined.

Thereafter, the controller 14 can determine the remaining bits (e.g. S12 to S1N in FIG. 4) of the first digital signal Dout1, by sequentially controlling the remaining sampling switching elements SW0 to SW N−2 in the same manner. A least significant bit (LSB) (e.g. S1N in FIG. 4) of the first digital signal Dout1 can be determined last. Since a person having ordinary skill in the art would understand the concept of the analog-to-digital conversion method using the successive approximation method, a more detailed description thereof is not provided.

Referring to FIG. 4 again, after outputting the first timing signal TS1 to the first SAR ADC 10, the timing controller 40 can output the second timing signal TS2 to the second SAR ADC 20 so that the conversion operation of the second SAR ADC 20 can start at the second time T2. Thus, the second SAR ADC 20 that receives the second timing signal TS2 can convert the second analog signal Vin2 into the second digital signal Dout2, similarly to the first SAR ADC 10 described above.

In this case, the second time T2 can be different from the first time T1. Thus, the time at which the MSB S11 of the first digital signal Dout1 is determined by the first SAR ADC 10 can be different from the time at which the MSB S21 of the second digital signal Dout2 is determined by the second SAR ADC 20. For example, the second time T2 can be later than the first time T1. Thus, the time at which the MSB S11 of the first digital signal Dout1 is determined by the first SAR ADC 10 can be sooner than the time at which the MSB S21 of the second digital signal Dout2 is determined by the second SAR ADC 20.

In an embodiment of the present disclosure, the time at which each bit S11 to S1N of the first digital data Dout1 is determined can be different from the time at which each bit S21 to S2N of the second digital data Dout2 is determined. That is, the time at which the plurality of sampling switching elements SW0 to SW(N−1) included in the first SAR ADC 10 is controlled can be different from the time at which the plurality of sampling switching elements SW0 to SW(N−1) included in the second SAR ADC 20 is controlled.

Figure 5:
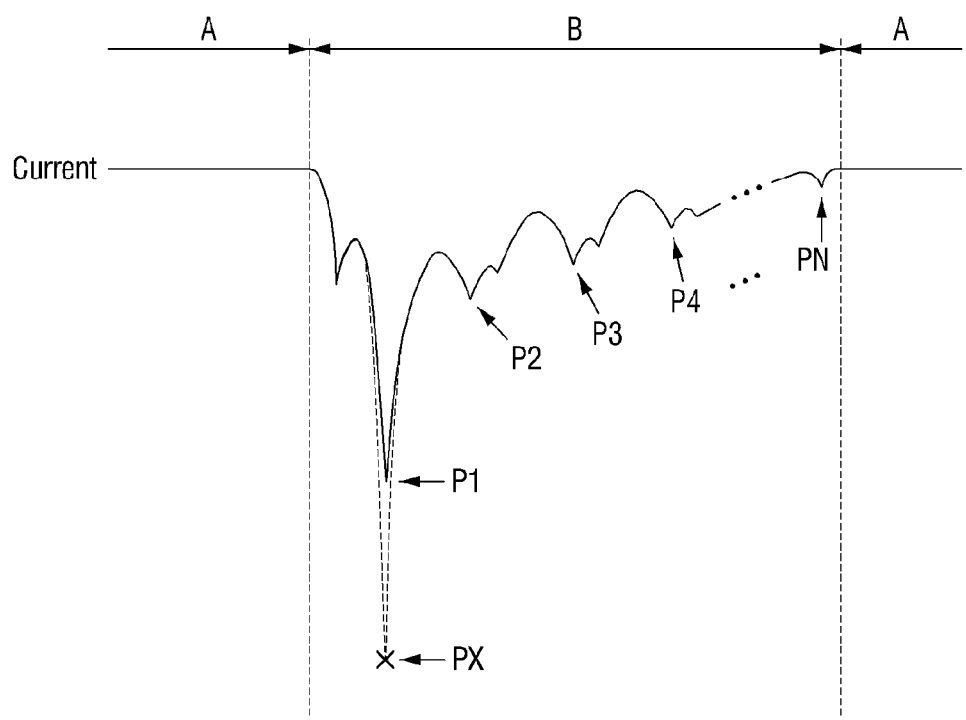
FIG. 5 is a chart of current for a semiconductor device according to an embodiment of the present disclosure.

FIG. 5 is a chart of current for a semiconductor device according to an embodiment of the present disclosure. FIG. 5 is a chart illustrating the current consumption of the section in which a SAR ADC performs a successive approximation conversion operation.

As described above, the capacitance of the reference capacitor Cref is much greater than the capacitances of the plurality of sampling capacitors C0 to C(N−1). Thus, an area occupied by the reference capacitor Cref in the semiconductor device or the semiconductor chip is large. Therefore, as in an embodiment of the present disclosure described above, when the first and second SAR ADCs 10 and 20 share the reference capacitor Cref, the size of the semiconductor device or the semiconductor integrated circuit or chip can be greatly reduced. Furthermore, when the plurality of SAR ADCs share the reference capacitor Cref, the size of the semiconductor device or the semiconductor chip can be further reduced.

Referring to FIG. 5, in section B in which the SAR ADC performs the successive approximation conversion operation, unlike the sampling section A, it is possible to know that the current consumption peaks P1 to PN occur. In this case, the respective peak current consumptions P1 to PN occur at the times at which each bit of the digital data is determined, and it is possible to know that the current consumption is most severe at the determination time of the MSB (see, current consumption peak P1).

Therefore, if the first and second SAR ADCs 10 and 20 share the reference capacitor Cref and the MSBs of the first and second digital signals Dout1 and Dout2 are determined at the same time in the above-mentioned embodiment of the present disclosure, the current consumption peak PX will be formed. The current consumption may adversely affect the operating characteristics of the semiconductor device or the semiconductor element. Thus, in an embodiment of the present disclosure, by setting the determination times of the MSBs in the first and second SAR ADCs 10 and 20 to be different, it is possible to prevent an occurrence of the current consumption peak PX that may adversely affect the operating characteristics of the semiconductor device or semiconductor element.

Figure 6:
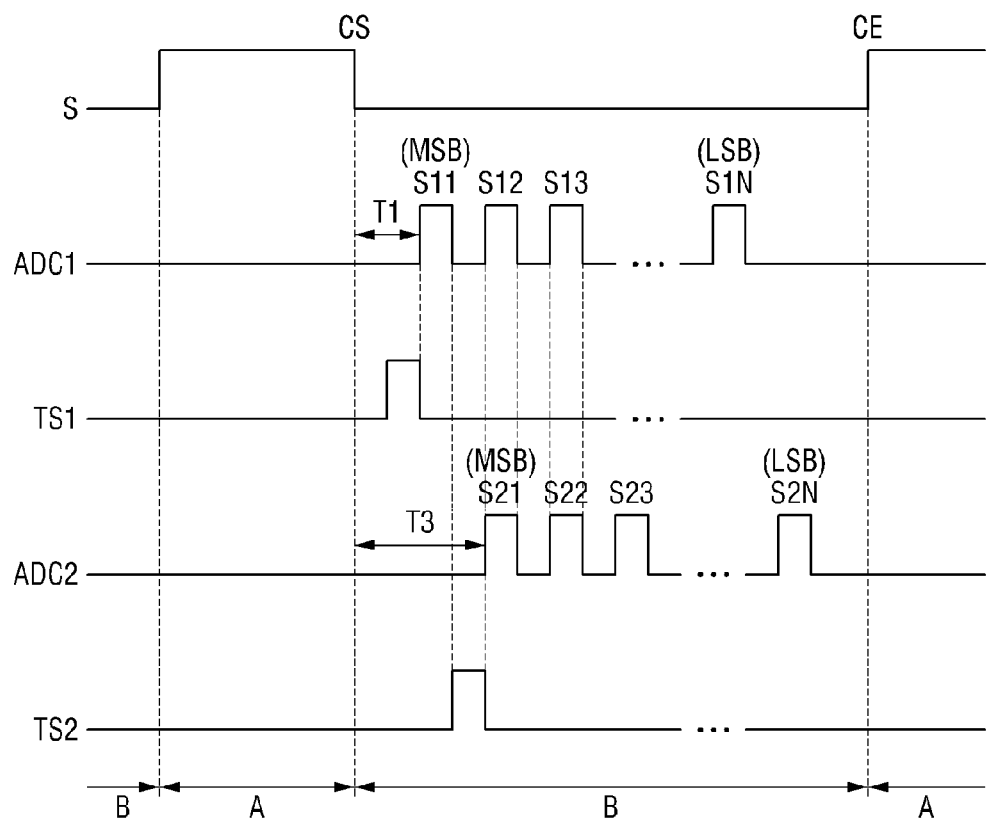
FIG. 6 is a timing diagram of an operation of a semiconductor device according to an embodiment of the present disclosure.

FIG. 6 is a timing diagram of an operation of a semiconductor device according to an embodiment of the present disclosure. Differences from an embodiment of the present disclosure described above are described below.

Referring to FIGS. 1, 2 and 6, the timing controller 40 of a semiconductor device can output a third timing signal TS3 to the second SAR ADC 20 so that the second SAR ADC 20 can start the analog-to-digital conversion operation at a third time T3 that is different from the first time (e.g. T1 in FIG. 4) and the second time (e.g. T2 in FIG. 4).

Thus, although the determination time of each bit S11 to S1N of the first digital data Dout1 is different from the determination time of each bit S21 to S2N of the second digital data Dout2 in the above-described embodiment, here, the determination time of bits S12 to S1N of the first digital data Dout1 can overlap the determination time of bits S21 to S2(N−1) of the second digital data Dout2, respectively.

For example, in the above-described embodiment of the present disclosure, although the plurality of sampling capacitors C0 to C(N−1) included in the first SAR ADC 10 and the plurality of sampling capacitors C0 to C(N−1) included in the second SAR ADC 20 are sequentially connected to the reference capacitor Cref, when some C0 to C(N−2) of the sampling capacitors included in the first SAR ADC 10 are connected to the reference capacitor Cref, some C1 to C(N−1) of the sampling capacitors included in the second SAR ADC 20 can also be connected to the reference capacitor Cref. That is, the control timing of the plurality of sampling switching elements SW0 to SW(N−1) of the controller 14 may be different from an above-described embodiment of the present disclosure.

Figure 7:
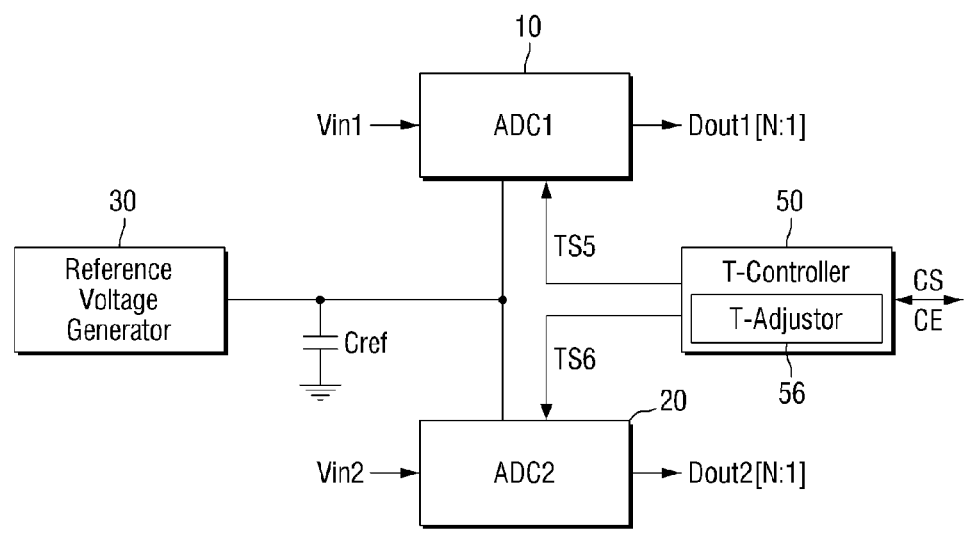
FIG. 7 is a block diagram of a semiconductor device according to an embodiment of the present disclosure.
Figure 8:
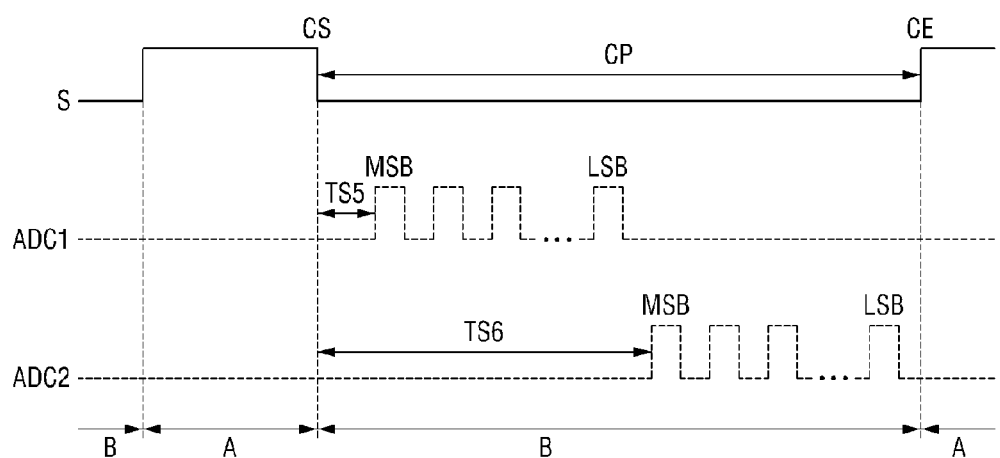
FIG. 8 is a timing diagram of an operation of a semiconductor device according to an embodiment of the present disclosure.

FIG. 7 is a block diagram of a semiconductor device 3 according to an embodiment of the present disclosure. The differences from an above-described embodiment of the present disclosure described above will be described below. FIG. 8 is a timing diagram of an operation of the semiconductor device 3 according to an embodiment of the present disclosure.

Referring to FIGS. 7 and 8, the timing controller 50 of the semiconductor device 3 can include a timing adjuster 56.

The timing adjuster 56 can determine the start time of the conversion operation of the first SAR ADC 10 and the start time of the conversion operation of the second SAR ADC 20, in consideration of a length CP of the section B of the FIG. 8 in which the analog-to-digital conversion operation is performed in the first and second SAR ADCs 10 and 20.

For example, the timing adjuster 56 generates a plurality of timing signals, and can select fifth and sixth timing signals TS5 and TS6 in which the first and second SAR ADCs 10 and 20 can complete the analog-to-digital conversion operation, while maximally and efficiently using the section B in which the sampling signal S is in the second level (e.g., a logic low level). That is, the timing adjuster 56 can select the fifth and sixth timing signals TS5 and TS6 in which the LSB of the second digital signal Dout2 can be determined, among the plurality of generated timing signals, before the sampling signal S is changed from the second level (e.g., a logic low level) to the first level (e.g., a logic high level).

The fifth and sixth timing signals TS5 and TS6 selected by the timing adjuster 56 are provided to the first and second SAR ADCs 10 and 20 by the timing controller 50, and can control the operation of the first and second SAR ADCs 10 and 20. Thus, when the first and second SAR ADCs 10 and 20 are controlled by the fifth and sixth timing signals TS5 and TS6, the analog-to-digital conversion operation can be performed, while maximally and efficiently using a given resource.

Figure 9:
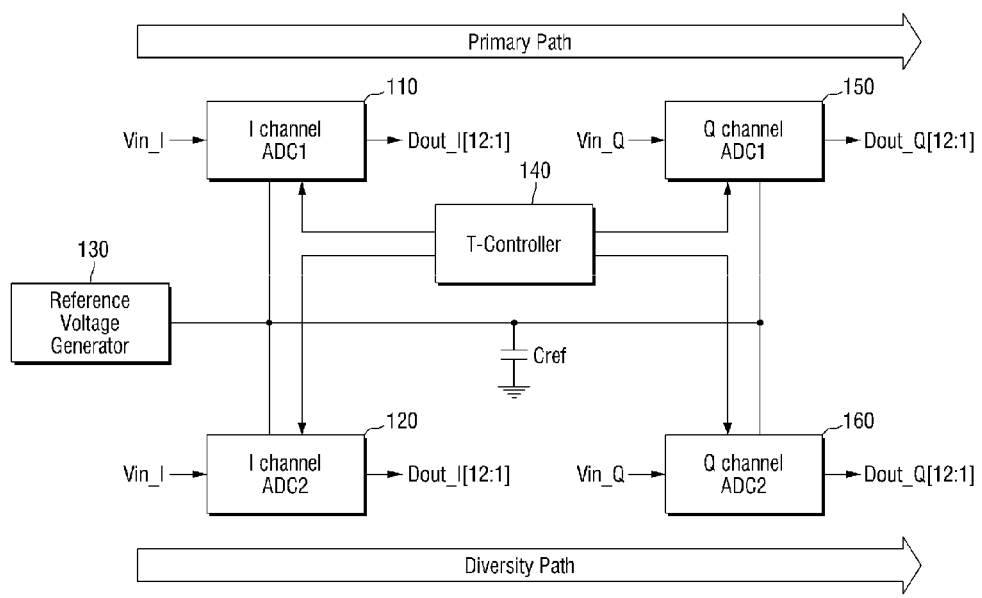
FIG. 9 is a block diagram of a semiconductor device according to an embodiment of the present disclosure.
Figure 10:
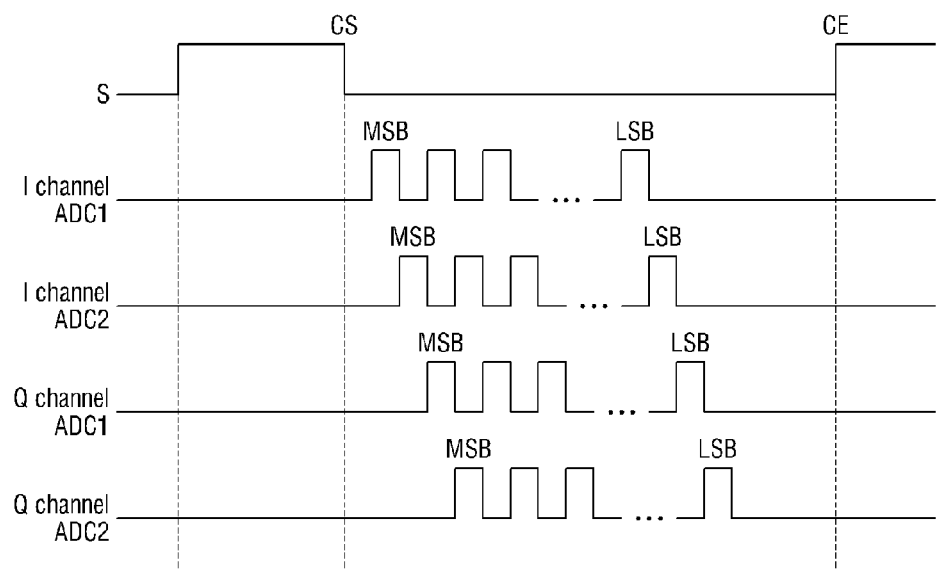
FIG. 10 is a timing diagram of an operation of a semiconductor device according to an embodiment of the present disclosure.

FIG. 9 is a block diagram of a semiconductor device according to an embodiment of the present disclosure. FIG. 10 is a timing diagram of an operation of the semiconductor device according to an embodiment of the present disclosure. Differences from an above-described embodiment of the present disclosure described above will be described below.

Referring to FIGS. 9 and 10, a semiconductor device 4 can include first to fourth SAR ADCs 110, 120, 150, and 160, a reference voltage generator 130, a timing controller 140, and a reference capacitor Cref shared by the first to fourth SAR ADCs 110, 120, 150, and 160.

The first to fourth SAR ADCs 110, 120, 150, and 160 can convert an analog signal into a digital signal through the successive approximation method. For example, the first and second SAR ADCs 110 and 120 receive an in-phase signal Vin_I and can output a digital signal Dout_I corresponding thereto. The third and fourth SAR ADCs 150 and 160 are provided with a quadrature phase signal Vin_Q and can output a digital signal Dout_Q corresponding thereto.

FIG. 9 illustrates that first and second SAR ADCs 110 and 120, for example, output the digital signal Dout_I including 12 bits, and the third and fourth SAR ADCs 150 and 160, for example, output the digital signal Dout_Q including 12 bits, but embodiments of the present disclosure are not limited thereto.

The first SAR ADC 110 and the third SAR ADC 150 can be disposed in a primary path, and the second SAR ADC 120 and the fourth SAR ADC 160 can be disposed in a diversity path.

The timing controller 140 can control the operation timing of the first to fourth SAR ADC 110, 120, 150, and 160. For example, referring to FIG. 10, the timing controller 140 can control the first to fourth SAR ADCs 110, 120, 150, and 160 so that all the determination times of the MSBs are different from each other, in the analog-to-digital conversion operation of the first to fourth SAR ADCs 110, 120, 150, and 160. Thus, all the determination times of the MSBs of the digital signals Dout_I, Dout_Q as the output of the first to fourth SAR ADCs 110, 120, 150, and 160 can be different from each other.

Figure 11:
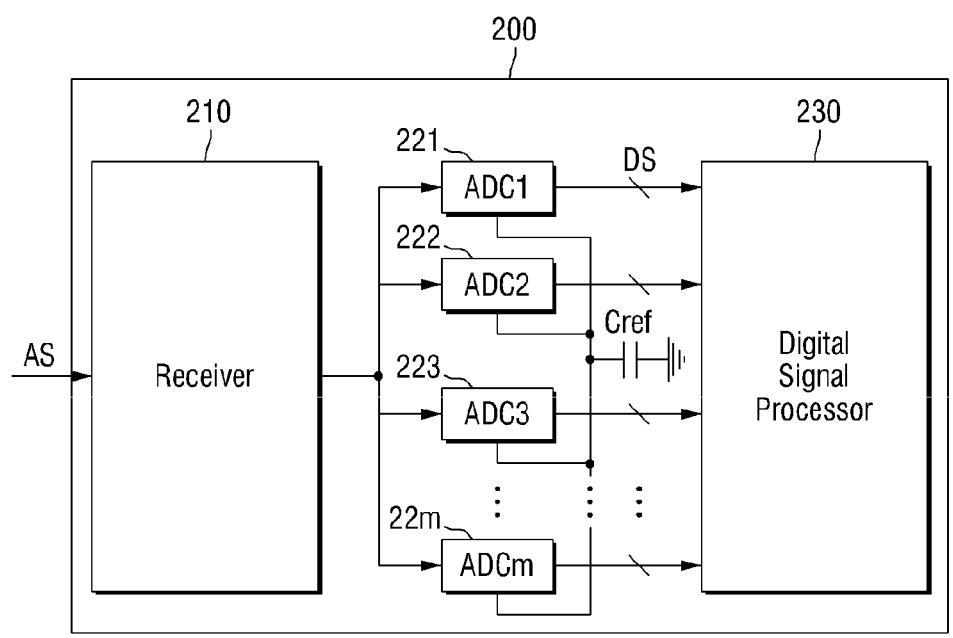
FIG. 11 is a block diagram of an SoC according to an embodiment of the present disclosure.

FIG. 11 is a block diagram of an SoC according to an embodiment of the present disclosure. Differences from an above-described embodiment of the present disclosure described above will be described below.

Referring to FIG. 11, an SoC, for example, can include a modem device 200.

The modem device 200 can include a receiver 210, a plurality of SAR ADCs 221 to 22$m$, a reference capacitor Cref and a digital signal processor 230.

The receiver 210 can receive an analog signal AS. In an embodiment of the present disclosure, the reception terminal 210 can receive a plurality of analog signals AS.

A plurality of SAR ADCs 221 to 22$m$ can convert the analog signal AS provided from the receiver 210 into the digital signal DS, using the successive approximation method. As illustrated, a plurality of SAR ADCs 221 to 22$m$ can share a reference capacitor Cref Although the drawings illustrate that all the SAR ADCs 221 to 22$m$ share one reference capacitor Cref, the present disclosure is not limited thereto. In an embodiment of the present disclosure, the plurality of SAR ADCs 221 to 22 can be grouped into several groups, and the respective groups can share one reference capacitor Cref.

The plurality of SAR ADCs 221 to 22$m$ can start the digital signal conversion operation at different times. For example, all the determination times of the MSB of the digital signal DS output from the plurality of SAR ADCs 221 to 22$m$ may be different from each other.

The digital signal processor 230 is provided with the digital signals DS that are output from the plurality of SAR ADCs 221 to 22$m$ and can perform a digital operation.

Since the plurality of SAR ADCs 221 to 22$m$ share the reference capacitor Cref, the area occupied by the reference capacitor Cref can be very small. Thus, as illustrated, the reference capacitor Cref can be disposed internally to the SoC 5 rather than externally to the SoC 5.

Figure 12:
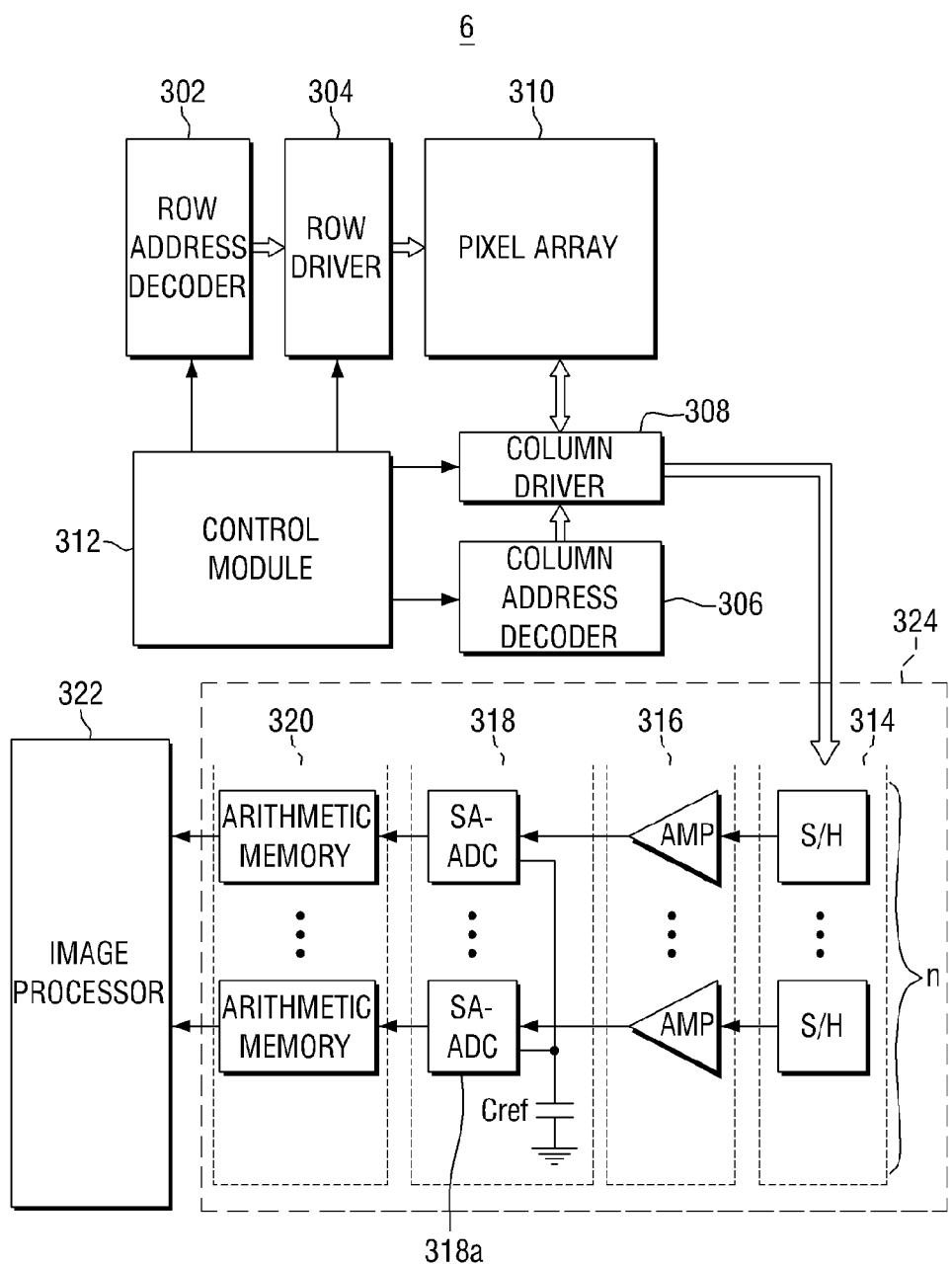
FIG. 12 is a block diagram of an SoC according to an embodiment of the present disclosure.

FIG. 12 is a block diagram of an SoC 6 according to an embodiment of the present disclosure.

Referring to FIG. 12, the SoC 6 can include a pixel array 310, a row driver 304, a row address decoder 302, a column driver 308, a column address decoder 306, a control module 312, a digital correlated double sampling module 324 and an image processor 322.

The pixel array 310 can have a plurality of pixels arranged in a predetermined number of rows and columns.

For example, the pixels located at the row of the pixel array 310 are simultaneously turned on by a row selection line, and the pixel signals of each column can be selectively provided to the output line by a column selection line. The plurality of row and column selection lines can be provided for all the pixel arrays 310.

The row driver 304 can selectively activate the row lines in response to the row address decoder 302. Also, the column driver 308 can selectively activate the column selection lines in response to the column address decoder 306. Thus, the row and column address can be provided to each pixel of the pixel array 310.

The control module 312 can control the row address decoder 302 and the column address decoder 306 that select the suitable row and column selection lines for pixel readout.

For example, the control module 312 can control the row driver 304 and the column driver 308 that apply a driving voltage to the respective drive transistors of the selected row and column selection lines.

The digital correlated double sampling module 324 can perform a digital correlated double sampling process, using the pixel reset signals and the pixel image signals concerning the selected pixels of each column of the pixel array 310.

The digital correlated double sampling module 324 can include a sample and hold (S/H) module 314, an amplifier (AMP) module 316, a successive approximation analog-to-digital converter (SA ADC) module 318 and an arithmetic memory module 320.

The S/H module 314 is associated with the column driver 308 and can include n S/H devices. Further, each S/H device can sample and hold a pixel reset signal and a pixel image signal for the selected pixels of the pixel array 310. In this case, n can include an integer and can express the number of the columns or a part thereof.

The amplifier module 316 includes n amplifiers and can amplify the sampled and held pixel reset signal and pixel image signal.

The successive approximation analog-to-digital converter module 318 includes n SA ADCs 318*a*, and each of the SA ADCs can convert the amplified pixel reset signal and pixel image signal into a digital signal, using the successive approximation method.

The n SA ADCs 318a can share the reference capacitor Cref. All the determination times of the MSBs of the digital signal in the n successive approximation analog-to-digital converters 318a, for example, can be different from each other.

The arithmetic memory module 320 includes n arithmetic memories. Each of the arithmetic memories can generate a digital difference signal, by effectively obtaining a difference between the digital pixel reset signal and the digital pixel image signal through an MSB first calculation. Here, the MSB first calculation can include an addition or a subtraction operation including a binary operation.

The image processor 322 provides a color reproduction of an output image of the the image captured by a plurality of pixels of the pixel array 310, by processing the digital difference signal provided by the arithmetic memory module 320.

For example, the image processor 322 executes various operations, and these various operations, for example, can include a positional gain adjustment, a deficiency correction, a noise reduction, an optical crosstalk reduction, demosaicing, resizing, sharpening or the like, but the present disclosure is not limited thereto.

Figure 13:
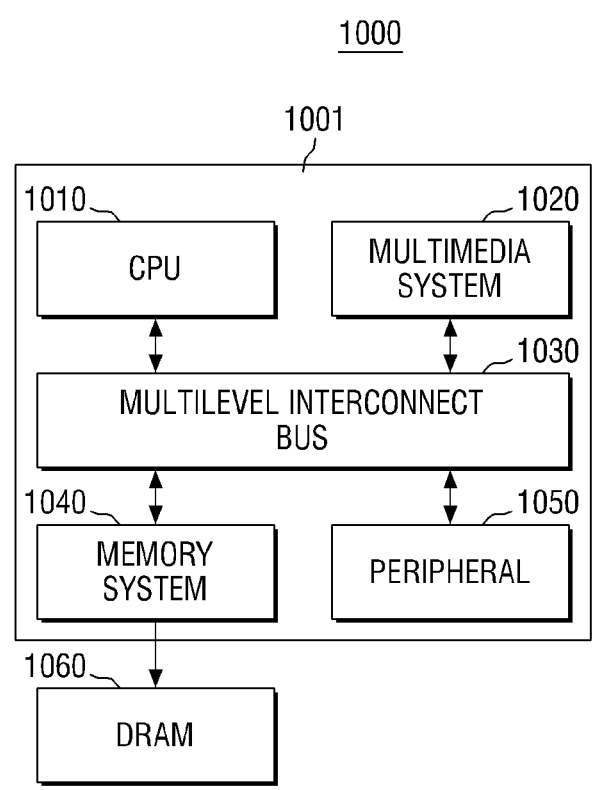
FIG. 13 is a block diagram of an SoC according to an embodiment of the present disclosure.

FIG. 13 is a block diagram of an SoC 1000 according to an embodiment of the present disclosure.

Referring to FIG. 13, the SoC 1000 includes an application processor 1001 and a dynamic random access memory (DRAM) 1060.

The application processor 1001 can include a central processing unit 1010, a multimedia system 1020, a multilevel connection bus 1030, a memory system 1040, a peripheral circuit 1050 and the like.

The central processing unit 1010 can perform the operations required for driving the SoC 1000. In an embodiment of the present disclosure, the central processing unit 1010 can include multiple cores.

The multimedia system 1020 can be used to perform a variety of multimedia functions in the SoC 1000. The multimedia system 1020 can include a 3D engine module, a video compression/decompression (codec), a display system, a camera system, a post-processor and the like.

The multilevel connection bus 1030 can be used to perform the mutual data communication of the central processing unit 1010, the multimedia system 1020, the memory system 1040 and the peripheral circuit 1050. In an embodiment of the present disclosure, the multilevel connection bus 1030 can have a multi-layer structure. For example, the multilevel connection bus 1030, a multi-layer advanced high-performance bus (AHB) or a multi-layer advanced eXtensible interface (AXI) can be used, but the present disclosure is not limited thereto.

The memory system 1040 can provide a necessary environment in which the application processor 1001 is connected to an external memory (e.g., DRAM 1060) to perform a high-speed operation. In an embodiment of the present disclosure, the memory system 1040 may include another controller (e.g., a DRAM controller) for controlling the external memory (e.g., DRAM 1060).

The peripheral circuit 1050 can provide a necessary environment in which the SoC 1000 is smoothly connected to an external device (e.g., a main board). Thus, the peripheral circuit 1050 can be provided with various interfaces which make the external device connected to the SoC 1000 compatible.

The DRAM 1060 can function as an operation memory required for operating the application processor 1001. In an embodiment of the present disclosure, as illustrated, the DRAM 1060 can be disposed externally to the application processor 1001. For example, the DRAM 1060 can be packaged in the form of a package on package (PoP) together with the application processor 1001.

At least one of the components of the SoC 1000 can adopt at least one of the semiconductor devices according to an above-described embodiment of the present disclosure.

Figure 14:
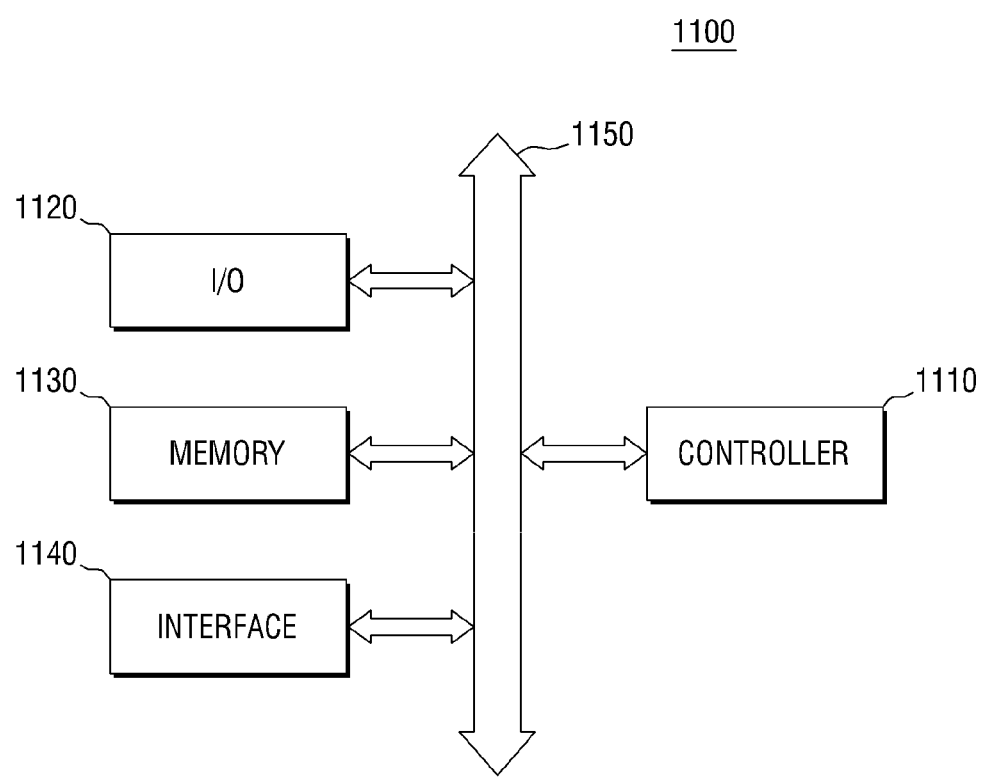
FIG. 14 is a block diagram of an electronic system including a semiconductor device and an SoC according to an embodiment of the present disclosure.

FIG. 14 is a block diagram of an electronic system 1100 that includes a semiconductor device according to an embodiment of the present disclosure.

Referring to FIG. 14, the electronic system 1100 can include a controller 1110, an input/output device (I/O) 1120, a memory device 1130, an interface 1140 and a bus 1150. The controller 1110, the input/output device 1120, the memory device 1130 and/or the interface 1140 can be coupled together via the bus 1150. The bus 1150 corresponds to a path through which data are moved.

The controller 1110 can include at least one of a microprocessor, a digital signal process, a microcontroller, and logic elements capable of performing the function similar to these elements. The input/output device 1120 can include a keypad, a keyboard, a display device and the like. The memory device 1130 can store data and/or instructions. The interface 1140 can perform the functions of transferring data to a communication network or receiving data from the communication network. The interface 1140 can be in a wired or wireless form. For example, the interface 1140 can include an antenna or a wired and wireless transceiver.

The electronic system 1100 can further include high-speed DRAM and/or synchronous DRAM (SDRAM) as an operation memory for improving the operation of the controller 1110.

The electronic system 1100 can be applied to a personal digital assistant (PDA), a portable computer, a web tablet, a wireless phone, a mobile phone, a digital music player, a memory card or all electronic products that can transmit and/or receive information in a wireless environment.

At least one of the components of the electronic system 1100 can adopt one of a semiconductor device or an SoC according to an embodiment of the present disclosure.

Figure 15:
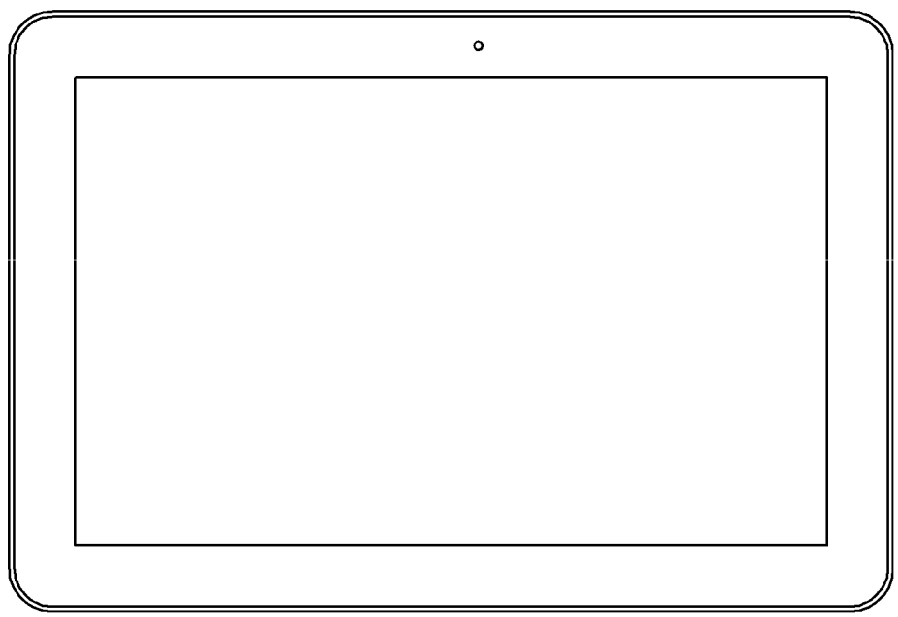
FIGS. 15 to 17 are illustrations of semiconductor systems to which a semiconductor device and an SoC according to an embodiment of the present disclosure are applicable.
Figure 16:
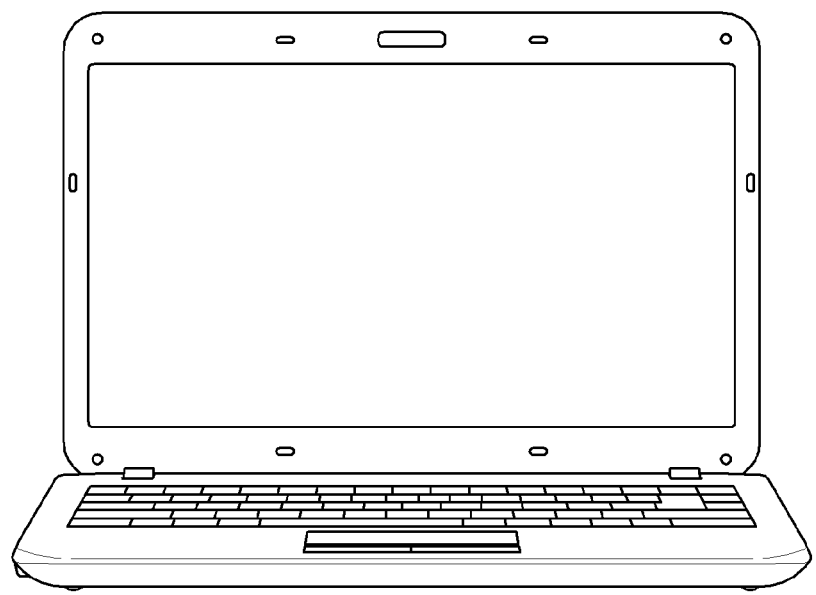
Figure 17:
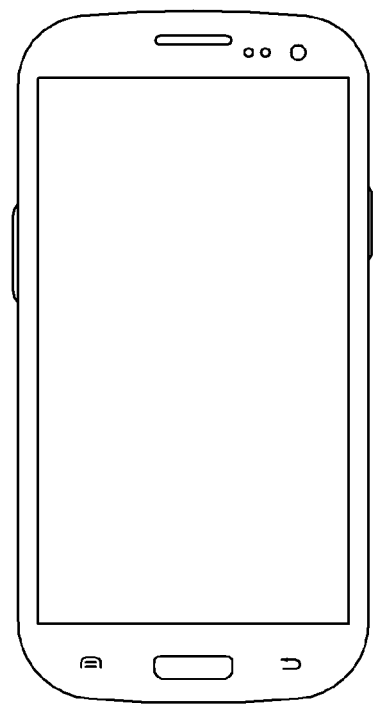

FIGS. 15 to 17 are illustrations of semiconductor systems to which a semiconductor device according to an embodiment of the present disclosure are applicable.

FIG. 15 is a diagram illustrating a tablet personal computer (PC) 1200, FIG. 16 is a diagram illustrating a laptop computer 1300, and FIG. 17 is a diagram illustrating a smart phone 1400. At least one of a semiconductor device or an SoC according to an embodiment of the present disclosure can be used for the tablet PC 1200, the laptop computer 1300, the smart phone 1400 or the like.

Further, it will be apparent to those skilled in the art that a semiconductor device according to an embodiment of the present disclosure is also applicable to other integrated circuit devices. That is, although only the tablet PC 1200, the laptop computer 1300 and the smart phone 1400 are described above as an example of a semiconductor system according to an embodiment of the present disclosure, the present disclosure is not limited thereto. In an embodiment of the present disclosure, a semiconductor system may be achieved by a computer, an ultra mobile PC (UMPC), a workstation, a net-book, personal digital assistants (PDA), a portable computer, a wireless phone, a mobile phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player or the like.

While the present disclosure has been shown and described with reference to certain embodiments thereof, it will be understood by those of ordinary skill in the art that various changes in form and details may be made therein without departing from the scope and spirit of the present disclosure as defined by the appended claims and their equivalents.

What is claimed is:

1. A semiconductor device, comprising:
   a reference capacitor that receives a reference voltage from a reference voltage generator;
   a first successive approximation register analog-to-digital converter (SAR ADC), for converting a first analog signal into a first digital signal, using a first sampling capacitor that has a first capacitance, connected to the reference capacitor through a first switching element, and a second sampling capacitor that has a second capacitance that is less than that of the first sampling capacitor, connected to the reference capacitor through a second switching element;
   a second SAR ADC, for converting a second analog signal into a second digital signal, using a third sampling capacitor that has a third capacitance, connected to the reference capacitor through a third switching element, and a fourth sampling capacitor that has a fourth capacitance that is less than that of the third sampling capacitor connected to the reference capacitor through a fourth switching element; and
   a controller configured to connect the first switching element and the third switching element to the reference capacitor at different times.

2. The semiconductor device of claim 1, wherein the first sampling capacitor is configured to determine a most significant bit (MSB) of the first digital signal, and the third sampling capacitor is configured to determine the MSB of the second digital signal.

3. The semiconductor device of claim 1, wherein the capacitance of the reference capacitor is greater than the capacitance of the first sampling capacitor, and
   the capacitance of the reference capacitor is greater than the capacitance of the second sampling capacitor.

4. The semiconductor device of claim 1, wherein the first analog signal includes an in-phase signal, and
   the second analog signal includes a quadrature phase signal.

5. The semiconductor device of claim 1, wherein the controller is further configured to sequentially connect the first switching element, the second switching element, the third switching element, and the fourth switching element to the reference capacitor.

6. The semiconductor device of claim 1, wherein the controller is further configured to connect the third switching element to the reference capacitor, while the second switching element is connected to the reference capacitor.

7. The semiconductor device of claim 1, wherein the controller includes a delay line configured to provide a control signal to the first switching element and the third switching element.

8. The semiconductor device of claim 1, further comprising:
   a third SAR ADC connected to the reference capacitor along with the first SAR ADC and the second SAR ADC for converting a third analog signal into a third digital signal, using the reference capacitor and a plurality of third sampling capacitors; and
   a fourth SAR ADC connected to the reference capacitor along with the first SAR ADC, the second SAR ADC, and the third SAR ADC for converting a fourth analog signal into a fourth digital signal, using the reference capacitor and a plurality of fourth sampling capacitors.

9. The semiconductor device of claim 8, wherein the first analog signal and the second analog signal include an in-phase signal, and
   the third analog signal and the fourth analog signal include a quadrature phase signal.

10. The semiconductor device of claim 1, further comprising:
    a third SAR ADC, for converting a third analog input signal into a third digital signal, using a fifth sampling capacitor that has a fifth capacitance and is connected to the reference capacitor through a fifth switching element, and a sixth sampling capacitor that has a sixth capacitance that is less than that of the fifth capacitance, connected to the reference capacitor through a sixth switching element; and
    a fourth SAR ADC, for converting a fourth analog input signal into a fourth digital signal, using a seventh sampling capacitor that has a seventh capacitance and is connected to the reference capacitor through a seventh switching element, and an eighth sampling capacitor that has an eighth capacitance that is less than that of the seventh capacitance, connected to the reference capacitor through an eighth switching element,
    wherein the controller is further configured to connect the first switching element, the third switching element, the fifth switching element and the seventh switching to the reference capacitor at different times.

11. The semiconductor device of claim 10, wherein the controller is further configured to connect the fifth switching element to the reference capacitor, while the second switching element is connected to the reference capacitor.

12. The semiconductor device of claim 11, wherein the controller is further configured to connect the seventh switching element to the reference capacitor, while the fourth switching element is connected to the reference capacitor.

13. A semiconductor device, comprising:
    a reference capacitor that receives a reference voltage from a reference voltage generator;
    a first successive approximation register analog-to-digital converter (SAR ADC) for converting a first analog signal into a first digital signal, using the reference capacitor and a plurality of first sampling capacitors having different capacitances;
    a second SAR ADC connected to the reference capacitor along with the first SAR ADC for converting a second analog signal into a second digital signal, using the reference capacitor and a plurality of second sampling capacitors having different capacitances; and
    a controller configured to connect a third sampling capacitor having a largest capacitance among the plurality of first sampling capacitors to the reference capacitor at a first time, and connect a fourth sampling capacitor having a largest capacitance among the plurality of second sampling capacitors to the reference capacitor at a second time different from the first time.

14. The semiconductor device of claim 13,
wherein the controller is further configured to not connect the fourth sampling capacitor to the reference capacitor, while the third sampling capacitor is connected to the reference capacitor.

15. The semiconductor device of claim 14,
wherein capacitance of the reference capacitor is greater than the capacitance of the third sampling capacitor, and
the capacitance of the reference capacitor is greater than the capacitance of the fourth sampling capacitor.

16. The semiconductor device of claim 13, further comprising:
a third SAR ADC and a fourth SAR ADC each connected to the reference capacitor along with the first SAR ADC and the second SAR ADC, wherein the third SAR ADC converts a third analog signal into a third digital signal, using the reference capacitor and a plurality of fifth sampling capacitors having different capacitances, and the fourth SAR ADC converts a fourth analog signal into a fourth digital signal, using the reference capacitor and a plurality of sixth sampling capacitors having different capacitances,
wherein the controller is further configured to connect one of the plurality of fifth sampling capacitors having a largest capacitance to the reference capacitor at a third time that is later than the second time, and connect one of the sixth sampling capacitors having a largest capacitance to the reference capacitor at a fourth time that is later than the third time.

17. A semiconductor device, comprising:
a first successive approximation register analog-to-digital converter (SAR ADC) for receiving a first analog signal when a sampling signal is in a first level and converting the first input analog signal into a first digital signal when the sampling signal is in a second level different from the first level, using a reference capacitor and a plurality of first sampling capacitors;
a second SAR ADC, for receiving a second analog signal when the sampling signal is in the first level and converting the second input analog signal into a second digital signal when the sampling signal is in the second level, using the reference capacitor, and a plurality of second sampling capacitors connected to the first SAR ADC; and
a controller configured to control the first SAR ADC and the second SAR ADC so that a determination time of a most significant bit (MSB) of the first digital signal is different from a determination time of an MSB of the second digital signal.

18. The semiconductor device of claim 17,
wherein the controller is further configured to control the determination time of the MSB of the first digital signal and the determination time of the MSB of the second digital signal, in consideration of a length of a section in which the sampling signal is in the second level.

19. The semiconductor device of claim 18,
wherein the controller is further configured to control the determination time of the MSB of the first digital signal and the determination time of the second digital signal so that a least significant bit (LSB) of the second digital signal is determined before the sampling signal is converted from the second level to the first level.

* * * * *